United States Patent
Futagawa

(10) Patent No.: US 7,183,584 B2
(45) Date of Patent: Feb. 27, 2007

(54) QUANTUM WELL STRUCTURE AND SEMICONDUCTOR DEVICE USING IT AND PRODUCTION METHOD OF SEMICONDUCTOR ELEMENT

(75) Inventor: Noriyuki Futagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 86 days.

(21) Appl. No.: 10/503,269

(22) PCT Filed: Jan. 31, 2003

(86) PCT No.: PCT/JP03/00976

§ 371 (c)(1),
(2), (4) Date: Aug. 2, 2004

(87) PCT Pub. No.: WO03/065526

PCT Pub. Date: Aug. 7, 2003

(65) Prior Publication Data

US 2005/0156153 A1    Jul. 21, 2005

(30) Foreign Application Priority Data

Jan. 31, 2002   (JP) .............................. 2002-024685

(51) Int. Cl.
*H01L 33/00* (2006.01)
(52) U.S. Cl. .................. 257/97; 257/14; 257/E33.008; 257/79; 438/29; 438/47
(58) Field of Classification Search ............ 257/97, 257/13, 14, 94, 79, E33.008; 438/22, 29, 438/47
See application file for complete search history.

(56) References Cited

U.S. PATENT DOCUMENTS

| 6,028,877 | A | * | 2/2000 | Kimura | ............... | 372/46.01 |
| 6,040,588 | A | * | 3/2000 | Koide et al. | ............... | 257/15 |
| 6,153,894 | A | * | 11/2000 | Udagawa | ............... | 257/96 |
| 6,337,493 | B1 | * | 1/2002 | Tanizawa et al. | ............... | 257/79 |
| 6,462,354 | B1 | * | 10/2002 | Okuyama | ............... | 257/13 |
| 6,515,313 | B1 | * | 2/2003 | Ibbetson et al. | ............... | 257/103 |
| 6,800,876 | B2 | * | 10/2004 | Edmond et al. | ............... | 257/94 |
| 2001/0032975 | A1 | * | 10/2001 | Yamaguchi et al. | ............... | 257/13 |
| 2003/0013223 | A1 | * | 1/2003 | Ramdani et al. | ............... | 438/46 |

FOREIGN PATENT DOCUMENTS

EP    1 313 187    5/2003

(Continued)

OTHER PUBLICATIONS

Campbell, Stephen, "The Science and Engineering of Microelectronic Fabrication," 1996, Oxford University Press, p. 43.*

*Primary Examiner*—Bradley K. Smith
*Assistant Examiner*—Steven J. Fulk
(74) *Attorney, Agent, or Firm*—Young & Thompson

(57) ABSTRACT

A semiconductor element excellent in luminous efficiency which sufficiently eliminates the effect of a piezo-electric field with the crystallinity of an active layer well retained. A quantum well active layer has a laminated structure in which a barrier layer undoped region (($In_{0.02}Ga_{0.98}N$ layer 702), a quantum well layer (undoped $In_{0.02}Ga_{0.8}N$ layer 703) and a barrier layer n-type region (n-type $In_{0.02}Ga_{0.98}N$ layer 701) are formed in this order. The Si concentration of a barrier layer n-type region is up to 5E18 cm−3.

25 Claims, 14 Drawing Sheets

FOREIGN PATENT DOCUMENTS

| | | |
|---|---|---|
| JP | 2000-133883 | 5/2000 |
| JP | 2000-223790 | 8/2000 |
| JP | 2000-277868 | 10/2000 |
| JP | 2000-332364 | 11/2000 |
| JP | 2001-102629 | 4/2001 |
| WO | WO 02/05399 | 1/2002 |

* cited by examiner

QUANTUM WELL STRUCTURE AND SEMICONDUCTOR DEVICE USING IT AND PRODUCTION METHOD OF SEMICONDUCTOR ELEMENT

TECHNICAL FIELD

The present invention relates to a quantum well structure, semiconductor device using the same, and a manufacturing method of the semiconductor device, and particularly relates to a semiconductor device provided with an active layer of the quantum well structure.

BACKGROUND OF THE ART

In a III-group nitride semiconductor optical device, a technique in which an active layer is made into a quantum well structure by alternately laminating a barrier layer and a quantum well layer has been in widespread use. Employing the quantum well structure enables achieving high power of the device.

In a laser of quantum well structure, however carrier separation occurs due to piezoelectric effect to sometimes deteriorate luminous efficiency. FIG. 1 is a view showing an energy band profile of a quantum well comprising InGaN. An electric field is applied to the inside of the quantum well by the piezoelectric effect and a band structure shown in FIG. 1 is formed to spatially separate electrons injected into the quantum well and positive holes. As a result, overlapping of wave function of the electrons and the positive holes decreases and the luminous efficiency is lowered due to reduction of optical transition probability. In addition, when the electrons and the positive holes recombine and emit light, since both are spatially separated, an emission wavelength becomes long.

To overcome the problems, a technique of doping Si (silicon) onto the barrier layer is often adopted in an InGaN quantum well structure (for instance, it is disclosed on page 211 in Appl. Phys. Lett. 72(2) by S. Nakamura et al.). When Si-doping is performed in the barrier layer, electrons are released into a crystal, and the electrons are distributed in the quantum well layer to block off a piezoelectric field. Prior art of performing Si-doping onto the barrier layer will be described below.

FIG. 2A to 2E are examples of the prior art of an active layer having Si-doped quantum well structure in a gallium nitride based semiconductor optical device. In FIG. 2A to 2E, shaded areas express Si-doped n-type regions and the other areas express undoped regions.

FIG. 2A shows a conventional Si-doped quantum well structure disclosed in Japanese Laid-Open Patent Publication No. 2000-133883, wherein Si is uniformly added as n-type impurity to a whole barrier layer, a quantum well layer is undoped, and the undoped quantum well layer and the barrier layer are combined, thereby enabling to improve of photoelectric conversion efficiency with low Vf and small leakage current and to obtain excellent light emitting output even with low power consumption. In the structure, however, the quantum well layer is formed on the Si-doped barrier layer, thereby sometimes causing an increase of dot defects in the quantum well layer and a rough boundary face of the quantum well layer and the barrier layer. Such deterioration in crystallinity becomes a trigger for reduction in the luminous efficiency.

FIGS. 2B and 2C show a conventional Si-doped quantum well structure disclosed in Japanese Laid-Open Patent Publication No.2000-332364. Each barrier layer is doped with Si, and a distribution (gradient) of Si concentration is formed in the interior of each barrier layer and in a through-thickness direction thereof. The distribution of the Si concentration is different in the cases of FIG. 2B in which an outermost surface is a Ga (gallium) surface (c-plane) and of FIG. 2C in which the outermost surface is an N (nitrogen) surface (-c-plane).

In the case that the outermost surface is the N (nitrogen) surface, when Si-doping is performed into each barrier layer, doping concentration is decreased as a p-type region side is got closer to from an n-type region side. In the case that the outermost surface is the Ga (gallium) surface, the doping concentration is decreased as the periphery of the n-type region side is got closer to from the p-type region side in a direction opposite to the case of N face. The gradient of the Si concentration in the through-thickness direction of a film enables effective reduction of the piezoelectric field. The Ga (gallium) surface (c-plane) and the N (nitrogen) surface (-c-plane) have a difference in their structure shown in FIGS. 3A and 3B, respectively, where a shaded area in FIG. 3A is the Ga surface and a shaded area in FIG. 3B is the N surface. Directions of the piezoelectric field generated in the Ga surface and the N surface are opposite each other. The above-mentioned publication discloses a doping profile such as FIGS. 2B and 2C in consideration of the direction of the piezoelectric field. The result of discussion by inventors of the present invention, however, confirms that the conventional structure is unable to sufficiently eliminate effects of the piezoelectric field.

FIG. 2D shows a conventional Si-doped quantum well structure disclosed in Japanese Laid-Open Patent Publication No.H11-3404559. According to the art described in the publication, a large amount of Si is doped into a barrier layer in a profile such as FIG. 2D, thereby generating an electric field in a direction opposite to the piezoelectric field between upper and lower barrier layer regions (A and B in the drawing) with sandwiching the quantum well layer, and resulting in preventing carrier separation caused by the piezoelectric field. However, it is necessary to dope a large amount of Si into the barrier layer in order to generate the electric field in the opposite direction having an electric field intensity in a level to negate the piezoelectric field. A paragraph (0010) of the publication describes that in the case of GaN, doping of 1E19 cm−3 or more is necessary, and an embodiment shows an example that impurity of 2E19 cm−3 or more is introduced. However, in the case that such a large amount of Si is introduced into the barrier layer, a lowering in a luminous efficiency such as an increase of defect in the active layer and a shortening of light emission life time is sometimes caused.

FIG. 2E shows a conventional Si-doped quantum well structure disclosed in Japanese Laid-Open Patent Publication No.2001-102629. As shown in FIG. 2E, Si is partially doped into each barrier layer, whereby the each barrier layer has a structure that an n-type doped region D is sandwiched by undoped regions C and E. Employing such a structure enables reduction in forward voltage without deterioration in property of the device. However, it has been difficult in the structure that effects of the piezoelectric field are sufficiently eliminated.

DISCLOSURE OF THE INVENTION

In consideration of the above-mentioned circumstance, an object of the present invention is to provide a semiconductor device which maintains an excellent crystallinity of an active layer and sufficiently eliminates an effect of a piezoelectric field thereby to be superior in luminous efficiency.

The present invention provides a quantum well structure, wherein a quantum well layer and a barrier layer consisting of a III-group nitride semiconductor is alternately laminated in a direction of a crystal axis expressed by [x, y, −(x+y), z] (where x and y are given integer numbers and z is a natural number), the barrier layer includes an n-type region doped with an n-type impurity and an undoped region, concentration of the impurity in the n-type region is 5E18 cm−3 or less on an average, an upper surface of the barrier layer comprises the undoped region, a lower surface of the quantum well layer is situated next to the undoped region, a lower surface of the barrier layer comprises the n-type region, and an upper surface of the quantum well layer is situated next to the n-type region.

According to the present invention, since the quantum well layer is formed on the undoped region, crystallinity of the quantum well layer is excellent, because deterioration in the crystallinity due to the n-type impurity is restrained.

The effect of the piezoelectric field is also curbed due to the n-type region of the barrier layer formed on the quantum well layer.

The present invention further provides a semiconductor device including a substrate and a quantum well structure formed on the substrate, wherein the quantum well structure is formed by alternately laminating a quantum well layer and a barrier layer consisting of a III-group nitride semiconductor in a direction of a crystal axis expressed by [x, y, −(x+y), z] (where x and y are given integer numbers and z is a natural number), the barrier layer includes an n-type region doped with an n-type impurity and an undoped region, concentration of the impurity in the n-type region is 5E18 cm−3 or less on an average, an upper surface of the barrier layer comprises the undoped region, a lower surface of the quantum well layer is situated next to the undoped region, a lower surface of the barrier layer comprises the n-type region, and an upper surface of the quantum well layer is situated next to the n-type region.

Further, the lower surface of the barrier layer comprises the n-type region and the upper surface of the quantum well layer is situated next to the n-type region.

According to the present invention, since the quantum well layer is formed on the undoped region, the crystallinity of the quantum well layer is excellent, because deterioration in the crystallinity due to the n-type impurity is restrained.

The effect of the piezoelectric field is also curbed due to the n-type region of the barrier layer formed on the quantum well layer.

A technique of Si-doping into a barrier layer directly on a quantum well layer is also disclosed in Japanese Laid-Open Patent Publication No.H11-340559. This is a method of generating an electric field in a direction opposite to the piezoelectric field in upper and lower regions which sandwich the quantum well layer, thereby preventing a carrier separation resulted from the piezoelectric field.

Contrary to this, the present invention is a method of injecting carrier into the quantum well layer from the barrier layer situated next to the quantum well layer, and thereby preventing the carrier separation resulting from the piezoelectric field and adopts a principle different from the technique described in the above-mentioned publication. Because of the difference of the principle, concentration of impurity in the barrier layer is set relatively low at 5E18 cm−3 or less in the present invention and is set at a quarter or less of extremely high concentration of the impurity in a level of 2E19 cm−3 described in the Japanese Laid-Open Patent Publication No.H11-340559. Therefore, it becomes possible to prevent an increase of defects in and active layer, shortening of light emission life, and lowering luminous efficiency resulting from the extremely high concentration of the impurity in a level of 2E19 cm−3.

According to study by inventors of the present invention, it is found that introduction of the impurity in such a low concentration enables restraint of carrier separation due to a sufficient piezoelectric field if the impurity is exactly introduced directly onto the quantum well layer. The present invention is based on such novel knowledge.

According to the present invention, a multiplier effect of the above-mentioned constitution enables maintaining a superior crystallinity of the active layer, reducing effect of the piezoelectric field, and achieving excellent luminous efficiency.

In the present invention, x and y are given integer numbers and z is a natural number. Thus, the present invention can provide a semiconductor device which maintains superior crystallinity of the active layer and sufficiently eliminates the effect of the piezoelectric field thereby to be more excellent luminous efficiency.

In the present invention, the barrier layer means a layer of which band gap is larger than the quantum well layer and also both upper and lower layers which sandwich the quantum well layer. In addition, in the present invention, the quantum well structure may be either a multi quantum well layer structure or a single quantum well layer structure.

The present invention further provides a method of manufacturing the quantum well structure comprising a III-group nitride semiconductor and comprising a quantum well layer and a barrier layer including an n-type region doped with an n-type impurity and an undoped region, comprising the steps of:

forming the n-type region while supplying a source gas of the III-group nitride semiconductor and a source gas of the n-type impurity;

continuing supply of the source gas of the III-group nitride semiconductor while suspending supply of the source gas of the n-type impurity; and initiating formation of the quantum well layer after growth atmosphere becomes a state in which the source gas of the n-type impurity does not exist substantially.

According to the manufacturing method of the present invention, however, the quantum well layer is formed in a state that the source gas of the n-type impurity is eliminated, therefore such problems can be solved.

This manufacturing method enables formation of the multi quantum well structure through a vapor growth method without taking out of a growth equipment. In this case, the time period from suspension of the supply of the source gas of the n-type impurity to initiation of the formation of the quantum well layer may typically be 30 second or more. Specifically, the manufacturing method may include first process of suspending the supply of the source gas of the n-type impurity after forming the n-type region, second process of forming the undoped region, and third process of forming the quantum well layer, and may set the time period from termination of the first process to the initiation of the third process to be 30 second or more. Thus, providing the time period of suspending the supply of the source gas enables effective prevention of mixing of the n-type impurity into a subsequent growth layer. The suspension time is preferably 60 second or more, more preferably 100 second or more. Hereby, the mixing of the n-type impurity into the growth layer can be securely prevented, and quality of crystal of the active layer, particularly of the quantum well layer, can be improved.

The quantum well structure according to the present invention may be applied to light emitting devices such as a semiconductor laser and a light emitting diode, light receiving devices such as a solar battery and a photo sensor, a modulators and the like as well as electronic devices such as FET (field-effect transistor). Specifically, when applied to the active layer of the light emitting device and a light guide layer, an excellent luminous efficiency can be achieved. When growing an n-type GaN in the electronic device, a GaN based semiconductor has extremely many defects, therefore it is necessary to add a large amount of n-type impurity in order to obtain a large mobility. Then, as shown in the present invention, doping of the n-type impurity is performed into only lower layer of the n-type layer, thereafter an undoped layer is grown, whereby a good-quality n-type semiconductor layer is obtained without deteriorating crystallinity of a layer growing in a upper layer.

A direction of lamination in the present invention means a direction that semiconductor layers are laminated on a substrate. Further, a term "undoped region" means not only a region undoped with impurity, but also a region that the n-type impurity is not doped at a specific concentration or more, includes a region containing a small amount of the n-type impurity and also includes a region intentionally lower in impurity concentration (an average impurity concentration) in comparison with "n-type region". Typically, when the impurity concentration of the n-type region is in a range from 1E17 cm−3 to 5E18 cm−3 on an average, the n-type impurity concentration of the undoped region is, for instance, less than 1E17 cm−3, preferably less than 1E16 cm−3.

BEST MODES FOR CARRYING OUT THE INVENTION

Figure 1:
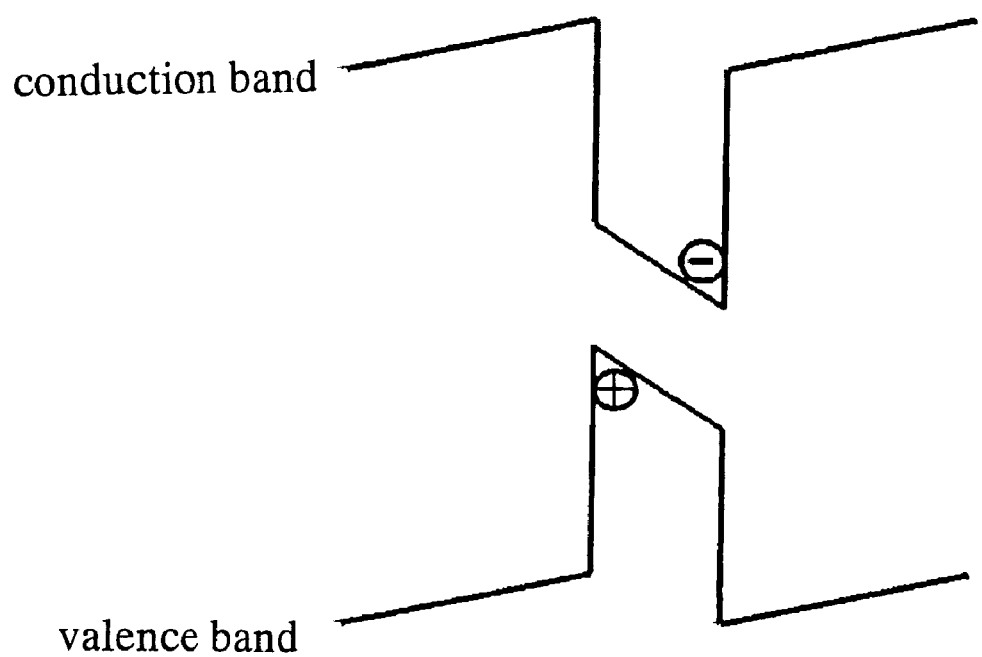
FIG. 1 is a view showing an energy band profile of a quantum well comprising InGaN.

In the present invention, an impurity concentration (average concentration) of an n-type region directly on a quantum well layer is 5E18 cm−3 or less. Thus, excellent crystallinity of an active layer is maintained, influence of piezoelectric field is reduced and superior luminous efficiency is achieved. When the impurity concentration of the n-type region is too high, the crystallinity of the active layer deteriorates and the luminous efficiency is lowered. A lower limit of the n-type impurity concentration is arbitrarily determined depending on a target performance and the like, preferably 1E17 cm−3 or more, and more preferably 5E17 cm−3. Thus, carrier separation due to the piezoelectric field can be sufficiently restrained and the luminous efficiency can be further more enhanced. In addition, the impurity concentration in a quantum well may be measured with, for instance, SIMS (Secondary Ion Mass Spectrometry).

In the present invention, a region directly beneath the quantum well layer is an undoped region. The undoped region means a region that the n-type impurity is not doped at a specific concentration or more, and includes a region containing a small amount of the n-type impurity. The n-type impurity concentration of the undoped region is, for instance, less than 1E17 cm−3, preferably less than 1E16 cm−3. Thus, the excellent crystallinity of the quantum well layer formed on the undoped region can be achieved and the luminous efficiency can be enhanced.

The active layer of the light emitting device according to the present invention may have a structure of either a multi quantum well or a single quantum well. When the multi quantum well structure is adopted, effects of the present invention that influence of the piezoelectric field is eliminated while the excellent crystallinity is maintained become more prominent. When the multi quantum well structure is adopted, procedures comprises the steps of forming a barrier layer n-type region, then forming a barrier layer undoped region, followed by forming the quantum well layer. Then, the time period that source supply of the n-type impurity is suspended after forming the n-type region for 30 second or more, preferably 60 second or more, and more preferably 100 second or more is provided, therefore mixing of the n-type impurity into a subsequent growth layer can be effectively prevented.

A light emitting device according to the present invention has a laminated structure that the quantum well layer is formed on the barrier layer undoped region and the barrier layer n-type region is formed thereon. Desirably, the undoped region of the barrier layer and the quantum well layer are directly contacted, however another layer of thickness of 2 nm or less may be sandwiched. Desirably, the quantum well layer and the n-type region of the barrier layer are directly contacted, however a thin film of thickness of 2 nm or less may be sandwiched. For instance, an undoped barrier layer of thickness of 2 nm or less may exist between the quantum well layer and the n-type region of the barrier layer.

Figure 4A:
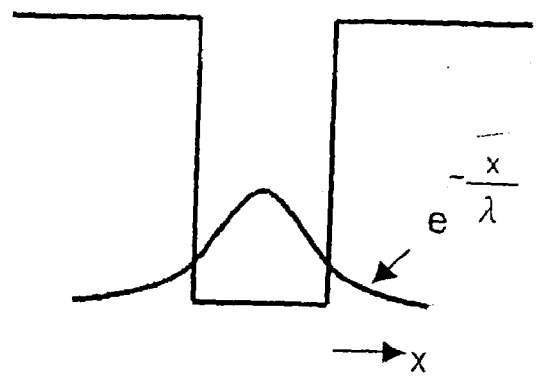
FIG. 4A is a view showing a broadening of a wave function of electrons at a quantum well and in the periphery thereof according to the present invention.
Figure 4B:
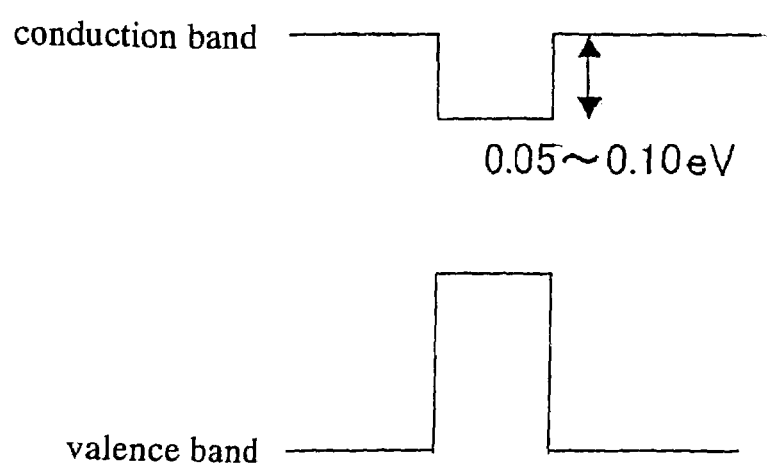
FIG. 4B is a view describing schematically a band structure of a quantum well according to the present invention.

In the present invention, the n-type impurity of a specific concentration is doped into the barrier layer directly on the quantum well layer. FIG. 4A is a view showing a broadening of a wave function of electrons at the quantum well and in the periphery thereof in the present invention. FIG. 4B is a view described schematically a band structure of the quantum well in the present invention. Si is doped into a part (bottom part) where the wave function of the electrons is broadened, so that the electrons are efficiently injected into the quantum well to effectively improve luminous efficiency. In addition, since proximity of the wave function of the electrons into the barrier layer is a level of 2 nm, doping within 2 nm directly on the quantum well layer is effective. This point is described below in reference to FIG. 4A.

The wave function with proximity into the barrier layer falls off exponentially as shown in FIG. 4A. Length of proximity $\lambda$ is given by $$\lambda = h/[2\pi\sqrt{(2\,mV)}]$$

where h is Planck constant (6.63E-34J·s), m is an effective mass (1.82E-31 kg), and V is a height of the barrier layer against a quantum well layer. The length of proximity $\lambda$ is obtained from these.

$$\lambda = h/[2\pi\sqrt{(2\,mV)}] \approx 2E-9\ (m)$$

Namely, the length of proximity $\lambda$ is obtained approximately 2 nm.

Based on the above result, when the n-type impurity is doped within 2 nm directly on the quantum well layer, effect of improving the luminous efficiency is prominent. When the n-type region exists in any part within 2 nm directly on the quantum well layer, the effect of the present invention is obtained. Namely, an extremely thin film of 2 nm or less may be sandwiched between the quantum well layer and the n-type region. However, since the wave function with proximity into the barrier layer falls off exponentially as shown in FIG. 4A, the n-type region is preferably provided so as to contact directly on the quantum well layer, whereby the above-mentioned effect is sufficiently obtained.

In the present invention, a thickness of the undoped region is preferably 3 nm or more, more preferably 5 nm or more, and the most preferably 7.5 nm or more. An upper limit of the thickness is not specifically provided, however, for instance, may be 20 nm or less. The undoped region of such thickness is provided, thereby to restore deterioration in crystallinity due to the n-type region and to improve the crystallinity of the quantum well layer formed thereon.

The thickness of the n-type region is also preferably 2 nm or more, and more preferably 3 nm or more. The upper limit is preferably 10 nm or less, and less preferably 8 nm or less. When the thickness of the n-type region is too thin, it is difficult to sufficiently block off the piezoelectric field. On the other hand, when the thickness of the n-type region is too thick, the crystallinity of the active layer sometimes deteriorates.

In the present invention, the n-type impurity concentration of a whole barrier layer combined the n-type region and the undoped region is preferably 3E18 cm-3 or less. Thus, the excellent crystallinity of the active layer is maintained and also a further superior luminous efficiency can be achieved.

In the present invention, a variety of substrates may be adopted. For instance, a III-group nitride semiconductor substrate such as GaN and AlGaN, different material substrate such as sapphire, SiC, and $MgAl_2O_4$, and so on may be used. In the case of using the III-group nitride semiconductor substrate, the effect of amelioration in the luminous efficiency is further more remarkable.

In the case that a laser structure comprising GaN based semiconductor is formed using the different material substrate such as sapphire, many defects are included in the active layer and carriers are captured in the defects, whereby nonradiative recombination and the like are likely to occur. As a method to avoid this problem, it is effective that relatively large amount of impurity such as Si is doped into the active layer to localize the same in the above-mentioned defects and the carriers are captured in the defects. However, when such a method is adopted, as described above, quality of crystal of the active layer of Si deteriorates and the luminous efficiency sometimes lowers.

Contrary to that, the III-group nitride semiconductor substrate is used as a substrate, and the substrate and the quantum well active layer with a doping profile of the n-type impurity defined in the present invention are combined, whereby sufficient effect to block off the piezoelectric field is obtained with a small amount of n-type impurity and the luminous efficiency can be effectively improved while the excellent crystallinity of the active layer is maintained.

From the above-mentioned viewpoint, a surface dislocation density of the III-group nitride semiconductor substrate is preferably, for instance, 1E8 pieces/cm2 or less. Such low dislocation substrate can be obtained through, for instance, FIELO (Facet-Initiated Epitaxial Lateral Overgrowth), Pendioepitaxy technique and so on described below.

(FIELO Technique)

A thin GaN is formed on a substrate made of sapphire etc. and a stripe-shaped $SiO_2$ mask is formed thereon. GaN is grown at an opening of the mask in selectively transverse direction to obtain a GaN layer with a low surface dislocation density. This is because dislocation is not only blocked by the $SiO_2$ mask, but also curved in a horizontal direction of the substrate when growing in the selectively transverse direction. This technique is described in "Applied Physics Vol. 68, No. 7 (1999), p 774–779" and so on.

(Pendioepitaxy Technique)

A low temperature buffer layer is formed on a substrate before a GaN layer consisting of a single crystal is formed. Selective etching is then performed using a mask to form a pattern of GaN extending in a stripe shape. Crystal is grown from the upper surface or the side surface of the GaN stripe to form a foundation layer with a low surface dislocation density. Pendioepitaxy technique is described, for instance, in "Tsvetankas. Zhelevaet. A 1.; MRS Internet J. Nitride Semicond, Res. 4S1, G3.38(1999)" and so on.

In addition, the surface dislocation density of the III-group nitride semiconductor substrate can be measured by publicly known methods such as measurement of etch-pit or TEM observation of a cross section part.

The present invention is effective for gallium nitride semiconductor expressed a general formula InxAlyGaN (where $0 \leq x \leq 1$, $0 \leq y \leq 1$) as a "III-group nitride semiconductor" in the present invention. In the case that a III-group nitride semiconductor layer has a wurtzeit-type crystal structure, the present invention is more effective. When using such material, a large piezoelectric field generates in an active layer and influence of the piezoelectric field is remarkable, whereby effect of restraining the piezoelectric field by the present invention becomes more meaningful and is prominently demonstrated.

A quantum well structure according to the present invention has a constitution that a quantum well layer and a barrier layer composed of the III-group nitride semiconductor are alternately laminated in a direction of a crystal axis expressed [x, y, −(x+y), z] (x and y are given integer numbers and z is a natural number). For instance, a semiconductor layer which is a III-group nitride semiconductor layer having a wurtzeit-type crystal structure and in which a crystal growth axis has a positive component in a direction of c-axis, namely [0001] direction can be listed. As such a semiconductor layer, for instance, when gallium nitride semiconductor is listed as an example, the semiconductor layer of which a growth surface is a plane (1 −1 0 1), a plane (1 1 −2 1) and so on is explained with an example.

Figure 3A:
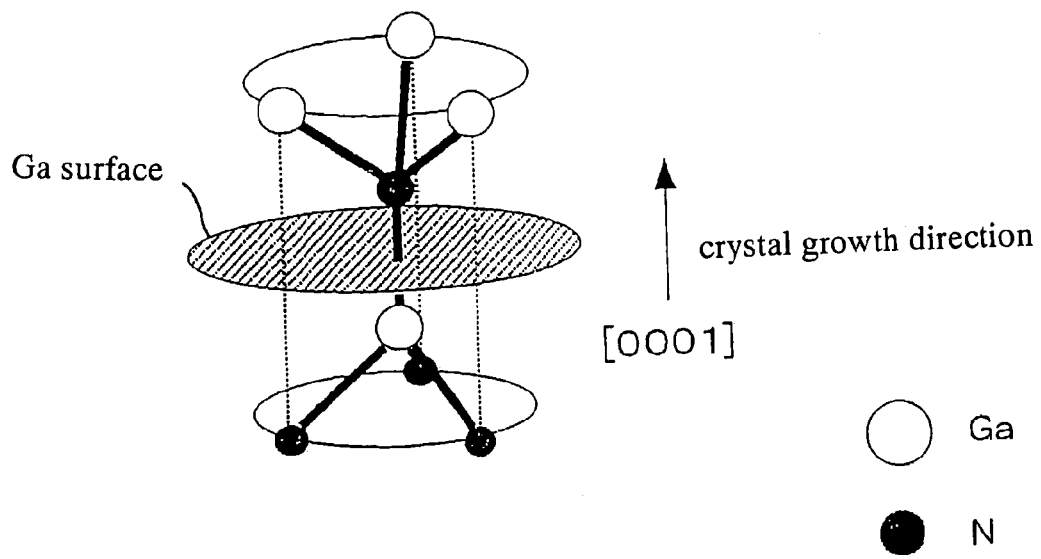
FIGS. 3A and 3B are views describing difference between Ga surface and N surface.
Figure 3B:
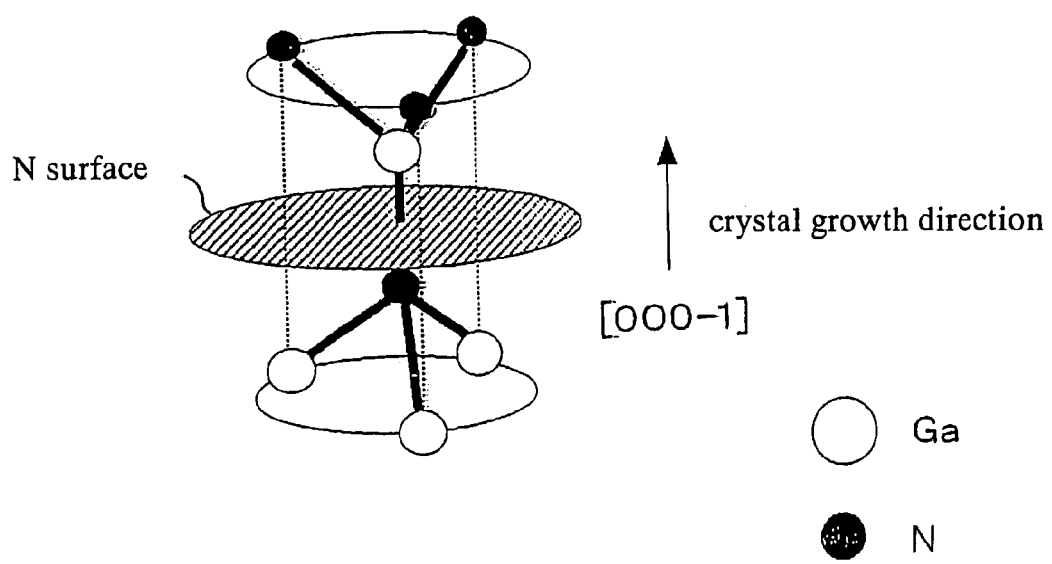

Such difference of crytal growth surface can be specified, for instance, by evaluating what element the outermost surface is composed from. In the case that $In_xAl_yGa_{1-x-y}N$ is selected as a semiconductor material (where $0 \leq x \leq 1$, $0 \leq y \leq 1$) and c-plane, that is (0001) plane, is the crystal growth surface, the outermost surface is Ga surface (c-plane) as shown in FIG. 3A. X-ray analysis is effective in order to confirm what surface the outermost surface is, however wet etching of the surface with a predetermined agent enables easy confirmation. For instance, in the case of gallium nitride based semiconductor, an etching agent such as potassium hydroxide is known to etch only an N polar surface, therefore use of this agent enables easy determination whether the Ga surface (c-plane) (FIG. 3A) or N surface (c-plane) (FIG. 3B).

It is important for the semiconductor layer having the crystal growth surface defined by the present invention to suitably select a crystal growth substrate, the crystal growth surface of the substrate, condition of growth of the semiconductor layer and so on. It is also important to perform a cleaning of a substrate surface on a appropriate condition. For instance, it is effective to apply a thermal treatment to the substrate surface in hydrogen atmosphere on a specific condition in order to grow the semiconductor layer of which the C-plane, that is (0001) plane, is the crystal growth surface on a sapphire c-plane.

The present invention is more effective in the case that the quantum well layer is applied to a constitution including In. It is known that In is easy to produce a phase separation in an active layer. Thus, when the piezoelectric field generates in the quantum well layer, phenomena such as multiplied oscillation wavelength or fluctuation of distribution of emission wavelength by injected electrical current is sometimes caused in combination with nonuniformity of composition due to the phase separation of In and an influence due to the piezoelectric field. The present invention enables effectively restraining such phenomena and demonstrating intrinsic property of the quantum well active layer including In.

In the present invention, n-type impurity preferably contains at least one element selected from a group consisting of Si, O, Ge, and Sn. Thus, lowering of the luminous efficiency due to the piezoelectric field can be effectively curbed.

In the present invention, a constitution in which the n-type impurity concentration decreases continuously in a region between the n-type region and the undoped region in the barrier layer can be adopted. Thus, an excellent crystallinity of the active layer is maintained, influence of the piezoelectric field is reduced and superior luminous efficiency can be achieved.

EXAMPLE 1

Figure 5:
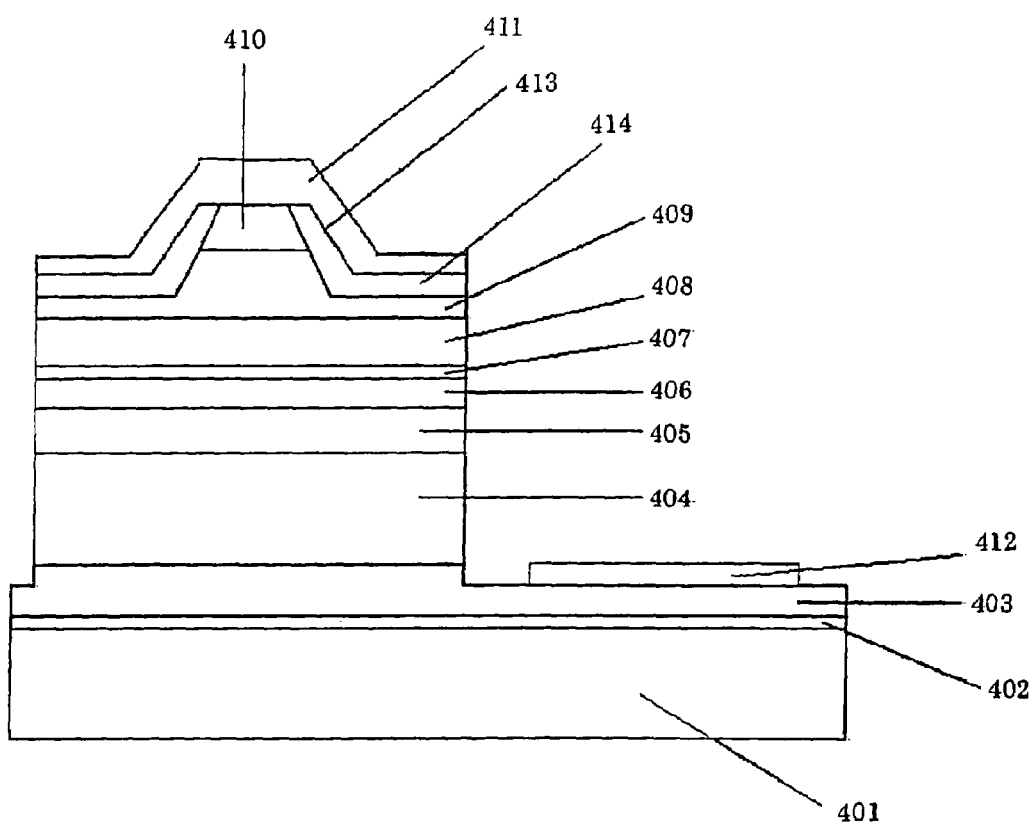
FIG. 5 is a schematic cross-sectional view of a III–V group nitride semiconductor laser according to first example in the present invention.

FIG. 5 is a schematic cross-sectional view of a III–V group nitride semiconductor laser according to the present invention. In FIG. 5, a low temperature GaN buffer layer 402 of thickness of 40 nm is formed on a sapphire substrate 401 of thickness of 330 μm whose surface is C-plane. An n-type GaN contact layer 403 of thickness of 1.5 μm is formed on the low temperature GaN buffer layer 402. An n-type $Al_{0.07}Ga_{0.93}N$ clad layer 404 of thickness of 1 μm is formed on the n-type GaN contact layer 403. An n-type GaN waveguide layer 405 of thickness of 0.1 μm is formed on the n-type $Al_{0.07}Ga_{0.93}N$ clad layer 404. A multi quantum well structure active layer 406 of three cycles comprising $In_{0.2}Ga_{0.8}N$ quantum well layer of thickness of 3 nm and $In_{0.02}Ga_{0.98}N$ barrier layer of thickness of 10 nm is formed on the n-type GaN waveguide layer 405. A p-type $Al_{0.2}Ga_{0.8}N$ cap layer 407 of thickness of 20 nm is formed on the multi quantum well structure active layer 406. A p-type GaN waveguide layer 408 of thickness of 0.1 μm is formed on the p-type $Al_{0.2}Ga_{0.8}N$ cap layer 407. A p-type $Al_{0.07}Ga_{0.93}N$ clad layer 409 of thickness of 0.6 μm is formed on the p-type GaN waveguide layer 408. A p-type GaN contact layer 410 of thickness of 0.05 μm is formed on the p-type $Al_{0.07}Ga_{0.93}N$ clad layer 409.

In FIG. 5, the p-type clad layer 409 and the p-type contact layer 410 are worked into a ridge structure 413 in a stripe shape of width of 3 μm through etching, and $SiO_2$ film 414 as a current constriction layer comprising an insulator is formed except the head part of the ridge structure 413. Electrical current is constricted only to the ridge section by the current constriction layer. A p-electrode 411 consisting of a double layer metal structure of Ni/Au is formed on the head part of the ridge structure 413 and the current constriction layer. On the other hand, an n-electrode 412 consisting of a double layer metal structure of Ti/Al is formed on the upper surface of an n-type GaN contact layer 403 exposed by the etching.

Then, a manufacturing process of a layer structure shown in FIG. 5 is described. A metal organic chemical vapor deposition (hereinafter referred to as MOCVD) was used for formation of each semiconductor layer. Growth pressure was 100 Torr in all regions of growth of the semiconductor layer. Ammonia (hereinafter referred to as $NH_3$) was used as a source of supply of a V-group element, trimethyl gallium (hereinafter referred to as TMG), trimethyl aluminum (hereinafter referred to as TMA), trimethyl indium (hereinafter referred to as TMI), bis(ethylcyclopentadienyl)magnesium (hereinafter referred to as $(EtCp)_2Mg$), silane (hereinafter $SiH_4$) were used as sources of supply of a III-group element and bubbling was performed to organic metal at respective cylinder temperatures of −10° C., 20° C., and 30° C. in N2 of pressure of 760 Torr to supply the saturated vapor in a reactor. The sapphire substrate 401 of which surface was C-plane is provided within the reactor and heated up to 1100° C. in hydrogen atmosphere and the surface of the substrate was cleaned. Temperature of the substrate was then made to 500° C. and a low temperature GaN buffer layer 402 of 40 nm was formed on the sapphire substrate 401 by supplying TMG at 5 sccm and $NH_3$ at 10 slm to form. The supply of TMG was then terminated and the temperature of the substrate was made to 1100° C. An n-type GaN contact layer 403 of thickness of 1.5 μm was then formed on the substrate by supplying TMG at 15 sccm, $SiH_4$ as a dopant at 5 sccm and $NH_3$ at 10 slm. An n-type $Al_{0.07}Ga_{0.93}N$ clad layer 404 of thickness of 1 μm was further formed on the substrate by supplying TMG at 15 sccm, TMA at 5 sccm, SiH$_4$ at 5 sccm and NH$_3$ at 10 slm. An n-type GaN waveguide layer 405 of thickness of 0.1 μm was then formed on the substrate by supplying TMG at 15 sccm, SiH$_4$ as a dopant at 5 sccm and NH$_3$ at 10 slm. The temperature of the substrate 401 is maintained at 800° C. and a multi quantum well structure active layer 406 comprising three cycles of In$_{0.2}$Ga$_{0.8}$N quantum well layer of film thickness of 3 nm and In$_{0.02}$Ga$_{0.98}$N barrier layer of film thickness of 5 nm was formed on the substrate by supplying TMG at 10 sccm, TMI at 50 sccm or 30 sccm, SiH$_4$ at 5 sccm and NH$_3$ at 10 slm.

Figure 6:
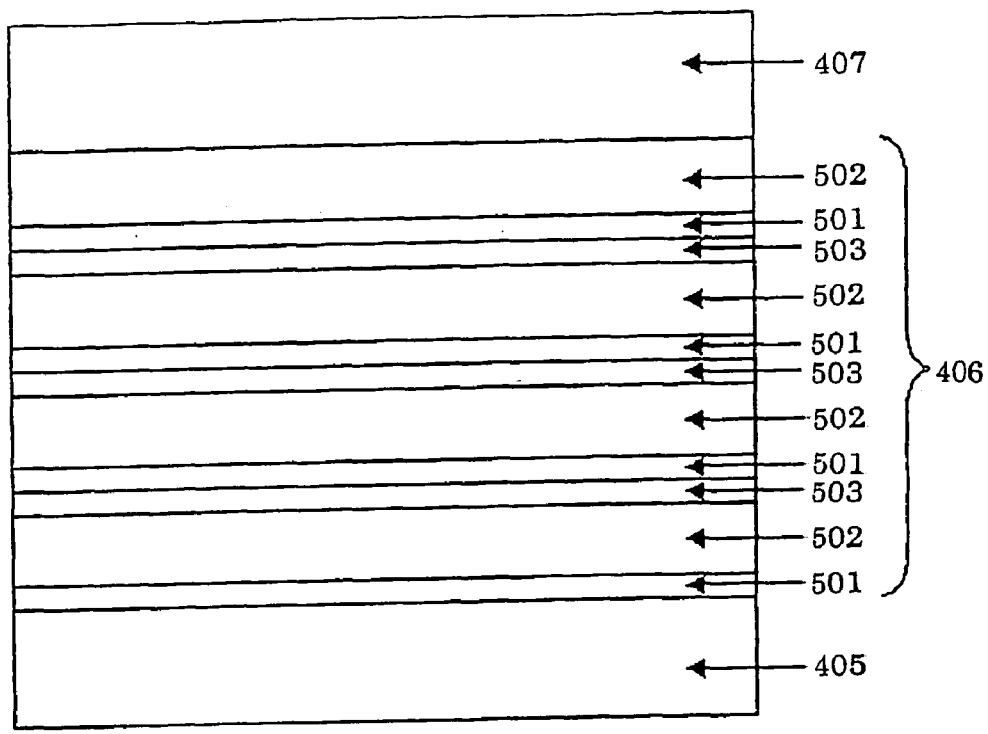
FIG. 6 is a view showing a structure of a multi quantum well structure active layer in FIG. 5.

Formation of the multi quantum well structure active layer 406 is described in detail in reference to FIG. 6. Temperature of the substrate 401 was maintained at 800° C., an n-type In$_{0.02}$Ga$_{0.98}$N barrier layer 501 of thickness of 2.5 nm is formed by supplying TMG at 10 sccm, TMI at 30 sccm, SiH$_4$ at 5 sccm and NH$_3$ at 10 slm. Only supply of SiH$_4$ is then suspended and the rest sources are kept on supplying for 100 second to form an undoped In$_{0.02}$Ga$_{0.98}$N barrier layer of film thickness of 7.5 nm. An amount of supply of TMI is further increased up to 50 sccm and an undoped In$_{0.2}$Ga$_{0.8}$N quantum well layer 503 of film thickness of 3 nm is formed. The processes are repeated three cycles and finished with the undoped In$_{0.02}$Ga$_{0.98}$N layer 502. The above-mentioned processes of forming the active layer were performed without taking out the substrate from a growth equipment.

A p-type Al$_{0.2}$Ga$_{0.8}$N cap layer 407 of thickness of 20 nm was formed on the active layer 406 formed in such manner by supplying TMG at 15 sccm, TMA at 5 sccm, (EtCp)$_2$Mg as a dopant at 5 sccm and NH$_3$ at 10 slm. The temperature of the substrate 401 was maintained at 1100° C., and a p-type GaN waveguide layer 408 of thickness of 0.1 μm was then formed on the substrate by supplying TMG at 15 sccm, (EtCp)$_2$Mg as a dopant at 5 sccm and NH$_3$ at 10 slm. A p-type Al$_{0.07}$Ga$_{0.93}$N clad layer 409 of thickness of 0.6 μm was further formed on the substrate by supplying TMG at 15 sccm, TMA at 5 sccm, (EtCp)$_2$Mg as a dopant at 5 sccm and NH$_3$ at 10 slm. An p-type GaN contact layer 410 of thickness of 0.05 μm was then formed on the substrate by supplying TMG at 15 sccm, (EtCp)$_2$Mg at 5 sccm and NH$_3$ at 10 slm. Thereafter, the substrate 401 was taken out of the growth equipment, and the p-type Al$_{0.07}$Ga$_{0.93}$N clad layer 409 and the p-type GaN contact layer 410 were worked into a ridge structure in a stripe shape of width of 3 μm through the etching. An SiO$_2$ film 414 was further formed except a head part of the ridge, and a p-electrode 411 consisting of a double layer metal structure of Ni/Au was formed through a vacuum deposition. The n-type GaN contact layer 403 was exposed through the etching and an n-electrode 412 consisting of a double layer metal structure of Ti/Al was formed thereon through the vacuum deposition.

The obtained active layer of a semiconductor laser has a laminated structure in which the undoped region of the barrier layer is directly contacted with a lower surface of the quantum well layer and the n-type region of the barrier layer is contacted with an upper surface of the quantum well layer. Profiles of respective layers are following.

The undoped region 502 of the barrier layer consists of the undoped In$_{0.2}$Ga$_{0.98}$N and has a layer thickness of 7.5 nm and Si concentration of less than 1E17 cm−3. The quantum well layer 503 consists of the undoped In$_{0.2}$Ga$_{0.8}$N, and has a layer thickness of 3 nm and Si concentration of less than 1E17 cm−3. The n-type region 501 of the barrier layer consists of the n-type In$_{0.02}$Ga$_{0.98}$N, and has a layer thickness of 5 nm and Si concentration (average value) of less than 4E18 cm−3. The Si concentration was measured with SIMS.

Figure 7:
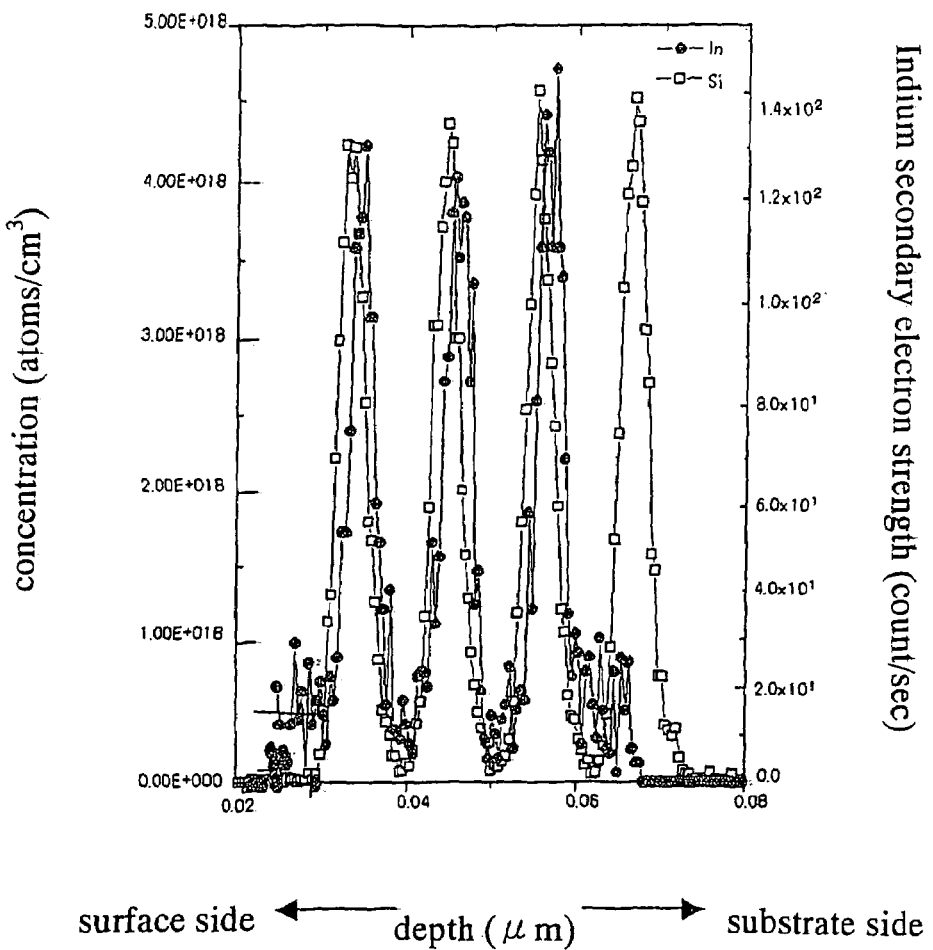
FIG. 7 is a Si concentration profile and an In concentration profile of a quantum well active layer obtained by an embodiment in the present invention.

FIG. 7 is a Si concentration profile and In concentration profile of the quantum well active layer obtained by the present invention, where □ expresses the Si concentration and ● expresses the In concentration. In SIMS analysis, ion beam burrows a sample, therefore the detected element is shot in a depth direction and the obtained profile has a train. Thus, from measurement results also in FIG. 7, Si looks to mix into the quantum well layer directly beneath the barrier layer, however Si is in practice doped only directly on the quantum well layer (undoped In$_{0.2}$Ga$_{0.8}$N quantum well layer 503) with good controllability.

Also as to a sample formed a semiconductor layer in a process same as the above, a simple evaluation by a wet etching was performed to investigate polarity of a p-type GaN contact layer 410, whereby the surface of the layer was confirmed to be Ga surface (c-plane).

As to a semiconductor laser in the present invention, evaluations of light emission strength and light emission life time were performed through an ordinary method to find the light emission strength of 10 a.u. and the light emission life time of 0.8 ns.

In the present invention, after the barrier layer doped with an n-type impurity is grown, a time period for which the n-type impurity source is suspended is provided, thereby preventing the n-type impurity source remained inside a reactor or a piping of a growth equipment from being supplied during growth of the quantum well layer, so that the quantum well layer is not contaminated by the n-type impurity to obtain a high-quality quantum well layer. Consequently, a light emitting device with high luminous efficiency as mentioned above can be obtained.

The n-type impurity disturbing the growth is not introduced into a portion directly beneath the quantum well layer in the barrier layer to be undoped, resulting in improving crystallinity. While growing the undoped layer, the crystallinity deteriorated in forming a doped layer is restored. Therefore, the crystallinity of the quantum well layer formed thereon is enhanced, and also from this point, the luminous efficiency of the light emitting device is ameliorated.

In addition, in the present invention, the barrier layer is formed with two kinds of layers of an n-type In$_{0.02}$Ga$_{0.98}$N barrier layer 501 and an undoped In$_{0.02}$Ga$_{0.98}$N barrier layer 502, however a layer with slope-like concentration change or a layer with stair-like concentration change is inserted between the two kinds of layers different in concentration of the n-type impurity, and the concentration is changed to obtain the same effect.

EXAMPLE 2

Figure 8:
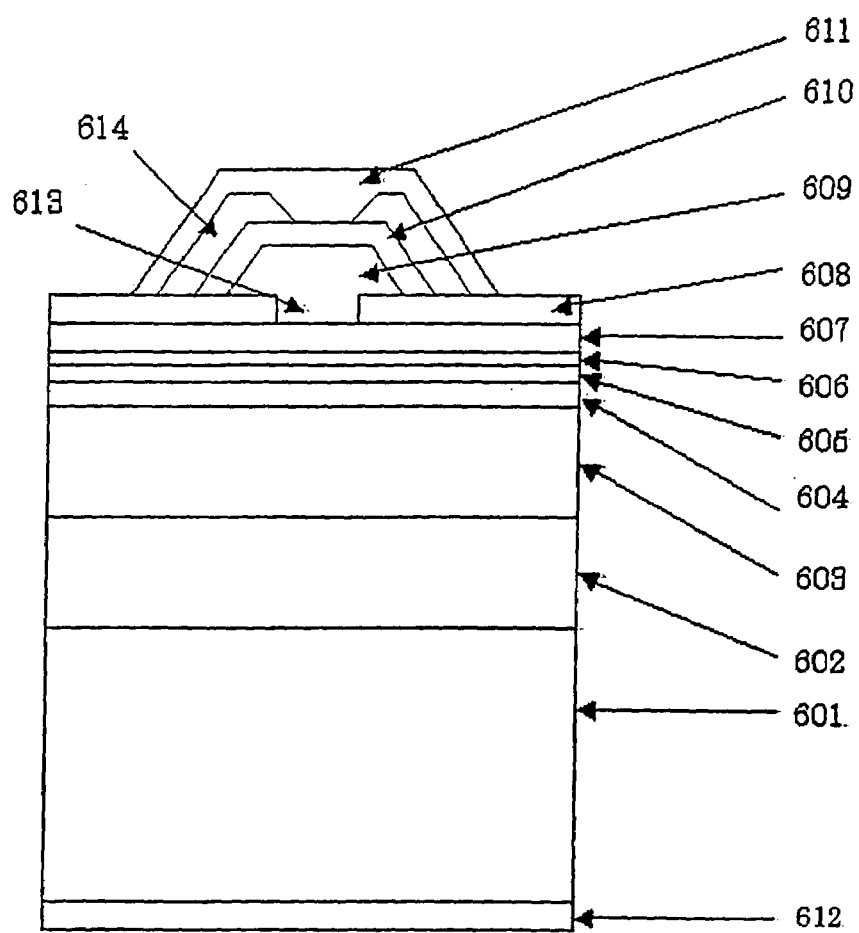
FIG. 8 is a schematic cross-sectional view of a III–V group nitride semiconductor laser according to a second example in the present invention.

FIG. 8 is a schematic cross-sectional view of a III V group nitride semiconductor laser according to the present invention. In FIG. 8, in the III V group nitride semiconductor laser, a laser structure is formed on a n-type GaN substrate 601 of thickness of 330 μm of which surface is C-plane. The n-type GaN substrate 601 is prepared through the aforementioned FIELO technique, and when density of etching pit generated using phosphoric acid system solution is measured, a surface dislocation density is less than 1E8 piece/cm2. The surface dislocation density is low, whereby a dislocation density of an active layer formed thereon can be reduced to obtain more prominently effect of improving the luminous efficiency due to a doping profile of n-type impurity according to the present invention. A manufacturing method for the semiconductor laser in the present invention is described below.

An n-type GaN layer 602 of thickness of 1.5 μm was formed on an n-type GaN substrate 601. An n-type $Al_{0.07}Ga_{0.93}N$ clad layer 603 of thickness of 1 μm was formed on the n-type GaN layer 602. An n-type GaN waveguide layer 604 of thickness of 0.1 μm was formed on the n-type $Al_{0.07}Ga_{0.93}N$ clad layer 603. A multi quantum well structure active layer 605 of three cycles comprising $In_{0.2}Ga_{0.8}N$ quantum well layer of thickness of 3 nm and $In_{0.02}Ga_{0.98}N$ barrier layer of thickness of 10 nm was formed on the n-type GaN waveguide layer 604. A p-type $Al_{0.2}Ga_{0.8}N$ cap layer 606 of thickness of 20 nm was formed on the multi quantum well structure active layer 605. A p-type GaN waveguide layer 607 of thickness of 0.1 μm was formed on the p-type $Al_{0.2}Ga_{0.8}N$ cap layer 606. An $SiO_2$ mask 608 of thickness of 0.2 μm with a stripe shaped opening 613 of width of 2 μm was formed on the p-type GaN waveguide layer 607. A p-type $Al_{0.07}Ga_{0.93}N$ clad layer 609 of thickness of 0.5 μm in a mesa shape was selectively formed on the $SiO_2$ mask 608 and the stripe shaped opening 613. A p-type GaN contact layer 610 of thickness of 0.05 μm iwa formed on the surface of the p-type $Al_{0.07}Ga_{0.93}N$ clad layer 609 in the mesa shape. An $SiO_2$ film 614 as a current constriction layer consisting of an insulator was formed except a head part of the mesa shape. Electrical current was constricted only a ridge portion by the current constriction layer. A p-electrode 611 comprising a double layer metal structure of Ni/Au was formed on the head part of the mesa shape and the current constriction layer. On the other hand, an n-electrode 612 comprising the double layer metal structure of Ti/Al was formed on the reverse surface of the n-type GaN substrate 601.

Forming processes of a semiconductor layer is then described. A MOCVD was used for formation of the semiconductor layer. Growth pressure was 100 Torr in all regions. $NH_3$ was used as a source of supply of a V-group element, TMG, TMA, TMI, $(EtCp)_2Mg$, and $SiH_4$ were used as sources of supply of III-group element and bubbling was performed to organic metals at respective cylinder temperatures of $-10°$ C., $20°$ C., and $30°$ C. in $N_2$ of pressure of 760 Torr to supply the saturated vapor into a reactor. An n-type GaN substrate 601 of which surface was C-plane was provided within the reactor and heated up to 1100° C. in hydrogen atmosphere and an n-type GaN layer 602 of thickness of 1.5 μm was formed on the substrate by supplying TMG at 15 sccm, $SiH_4$ as a dopant at 5 sccm and $NH_3$ at 10 slm. An n-type $Al_{0.07}Ga_{0.93}N$ clad layer 603 of thickness of 1 μm was further formed on the substrate by supplying TMG at 15 sccm, TMA at 5 sccm, $SiH_4$ at 5 sccm and $NH_3$ at 10 slm. An n-type GaN waveguide layer 604 of thickness of 0.1 μm was then formed by supplying TMG at 15 sccm, $SiH_4$ at 5 sccm and $NH_3$ at 10 slm. The temperature of the n-type GaN substrate 601 was maintained at 800° C. and a multi quantum well structure active layer 605 comprising three cycles of $In_{0.2}Ga_{0.8}N$ quantum well layer of film thickness of 3 nm and $In_{0.02}Ga_{0.98}N$ barrier layer of film thickness of 10 nm was formed on the substrate by supplying TMG at 10 sccm, TMI at 50 sccm or 30 sccm, and $NH_3$ at 10 slm.

Figure 9:
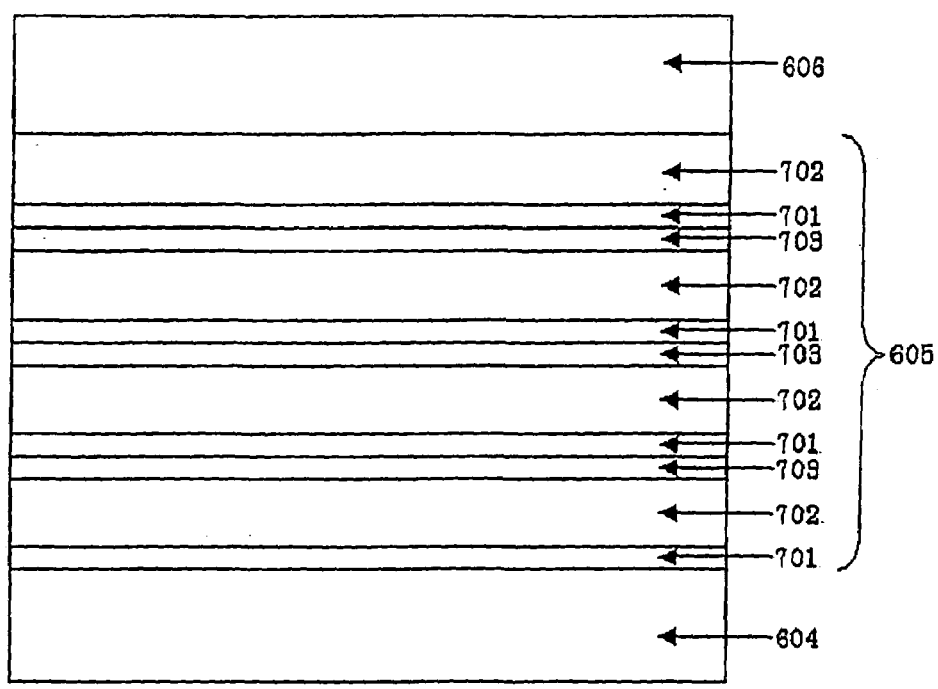
FIG. 9 is a view showing a structure of a multi quantum well structure active layer in FIG. 8.

Formation of the multi quantum well structure active layer 605 is described in detail in reference to FIG. 9. Temperature of the n-type GaN substrate 601 was maintained at 800° C., an n-type $In_{0.02}Ga_{0.98}N$ layer 701 of film thickness of 2.5 nm was formed by supplying TMG at 10 sccm, TMI at 30 sccm, $SiH_4$ at 5 sccm and $NH_3$ at 10 slm. Only supply of $SiH_4$ was then suspended and the rest sources were kept on supplying for 100 second to form an undoped $In_{0.02}Ga_{098}N$ layer of film thickness of 7.5 nm. An amount of supply of TMI was further increased up to 50 sccm and an undoped $In_{0.2}Ga_{0.8}N$ layer 703 of film thickness of 3 nm was formed. The processes were repeated three cycles and finished with the undoped $In_{0.02}Ga_{0.98}N$ layer 702. The above-mentioned processes of forming the active layer were performed without taking out the substrate from a growth equipment.

A p-type $Al_{0.2}Ga_{0.8}N$ cap layer 606 of thickness of 20 nm was then formed on the quantum well structure active layer 605 by supplying TMG at 15 sccm, TMA at 5 sccm, $(EtCp)_2Mg$ as a dopant at 5 sccm and $NH_3$ at 10 slm. The temperature of the n-type GaN substrate 601 was maintained at 1100° C., and a p-type GaN waveguide layer 607 of thickness of 0.1 μm was then formed on the substrate by supplying TMG at 15 sccm, $(EtCp)_2Mg$ as a dopant at 5 sccm and $NH_3$ at 10 slm.

A silicon oxide mask 608 was then formed. At first, after the n-type GaN substrate 601 was cooled down to room temperature to be taken out of the growth equipment and a silicon oxide film of film thickness of 0.2 μm was formed with a sputtering device. Thereafter, an opening 613 of width of 2.0 μm was formed on the silicon oxide film in a photolithography process and an etching process. The n-type GaN substrate 601 was then set on the growth equipment and heat up to 1100° C. again and a p-type $Al_{0.2}Ga_{0.8}N$ clad layer 609 of thickness of 0.5 μm was further formed by supplying TMG at 15 sccm, TMA at 5 sccm, $(EtCp)_2Mg$ at 5 sccm and $NH_3$ at 10 slm. An p-type GaN contact layer 610 of thickness of 0.05 μm was then formed by supplying TMG at 15 sccm, $(EtCp)_2Mg$ at 5 sccm and $NH_3$ at 10 slm. Thereafter, the substrate was taken out of the growth equipment and the silicon oxide film 614 was formed except a head part of the ridge. A p-electrode 611 consisting of a double layer metal structure of Ni/Au was further formed through a vacuum deposition. An n-electrode 612 consisting of a double layer metal structure of Ti/Al was also formed on a reverse surface of the n-type GaN substrate 601 through the vacuum deposition.

The obtained active layer of a semiconductor laser has a laminated structure in which the undoped region of the barrier layer is directly contacted with a lower surface of the quantum well layer and the n-type region of the barrier layer is contacted with an upper surface of the quantum well layer. Profiles of respective layers are following.

The undoped region 702 of the barrier layer consists of $In_{0.02}Ga_{0.98}N$ and has a layer thickness of 7.5 nm and Si concentration of less than 1E17 cm−3. The quantum well layer 703 consists of the undoped $In_{0.2}Ga_{0.8}N$ and has a layer thickness of 3 nm and Si concentration of less than 1E17 cm−3. The n-type region 701 of the barrier layer consists of the n-type $In_{0.02}Ga_{0.98}N$ and has a layer thickness of 2.5 nm and Si concentration (average value) of less than 4E18 cm−3. The Si concentration was measured with SIMS.

Also as to a sample formed a semiconductor layer in a process same as the above, a simple evaluation by a wet etching was performed to investigate polarity of a p-type GaN contact layer 610, whereby the surface of the layer was confirmed to be Ga surface (c-plane).

As to a semiconductor laser in the present invention, evaluations of light emission strength and light emission life time were performed through an ordinary method to find the light emission strength of 12 a.u. and the light emission life time of 1.0 ns.

In the present invention, after the barrier layer doped with an n-type impurity is grown, a time period for which the n-type impurity source is suspended is provided, thereby preventing the n-type impurity source remained inside a reactor or a piping of a growth equipment from being supplied during growth of the quantum well layer, so that the quantum well layer is not contaminated by the n-type impurity to obtain a high-quality quantum well layer. Consequently, a light emitting device with high luminous efficiency as mentioned above can be obtained.

The n-type impurity disturbing the growth is not introduced into a portion directly beneath the quantum well layer in the barrier layer to be undoped, resulting in improving crystallinity. While growing the undoped layer, the crystallinity deteriorated in forming a doped layer is restored. Therefore, the crystallinity of the quantum well layer formed thereon can be improved, and also from this point, the luminous efficiency of the light emitting device is ameliorated.

In addition, in the present invention, the n-type GaN substrate 601 with a low dislocation density is used as a crystal growth foundation substrate. Therefore, the crystallinity of the quantum well active layer is more excellent than the case that sapphire substrate is used and effect of improving the luminous efficiency due to employing the above-mentioned Si concentration profile is more prominent.

In addition, in the present invention, the barrier layer is formed with two kinds of layers of an n-type impurity doped layer 701 and an undoped layer 702, however a layer with slope-like concentration change and a layer with stair-like concentration change is inserted between the two kinds of layers different in concentration of the n-type impurity, and the concentration is changed to also obtain the same effect.

COMPARATIVE EXAMPLE 1

Figure 2A:
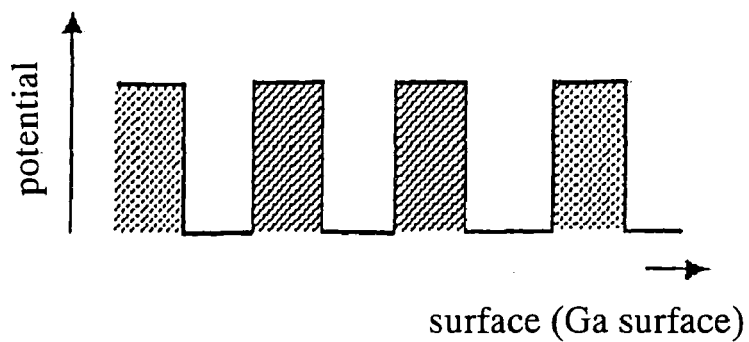
FIG. 2A to 2E are examples of prior arts of an active layer having a quantum well structure doped with Si in a gallium nitride based semiconductor optical device.
Figure 2B:
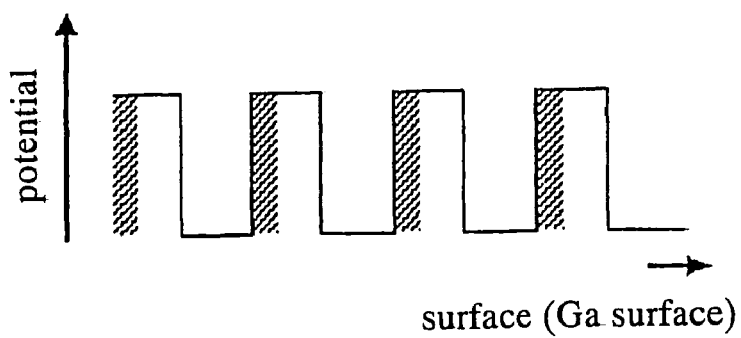
Figure 2C:
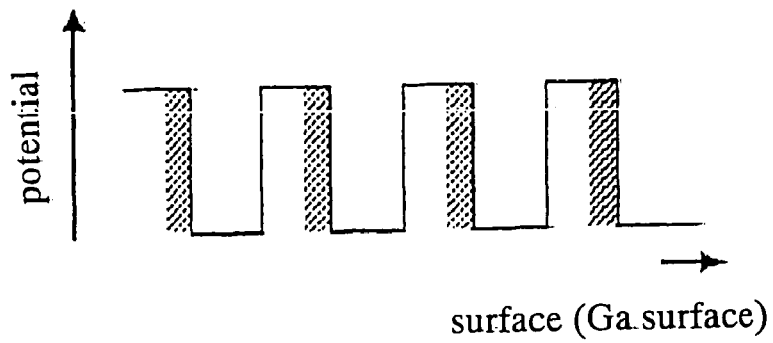
Figure 2D:
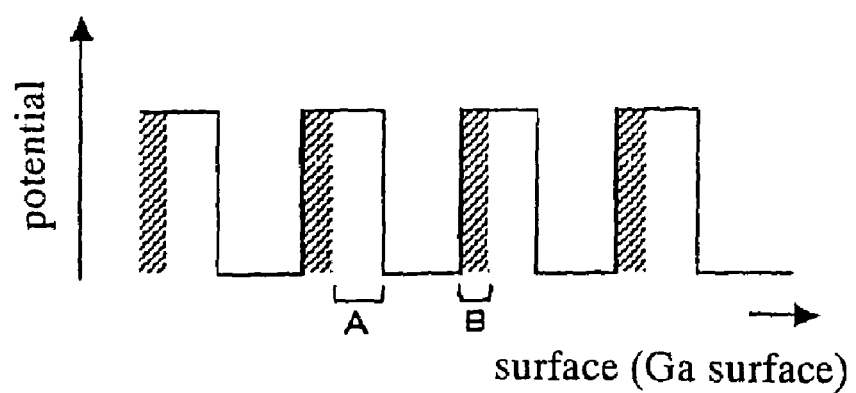
Figure 2E:
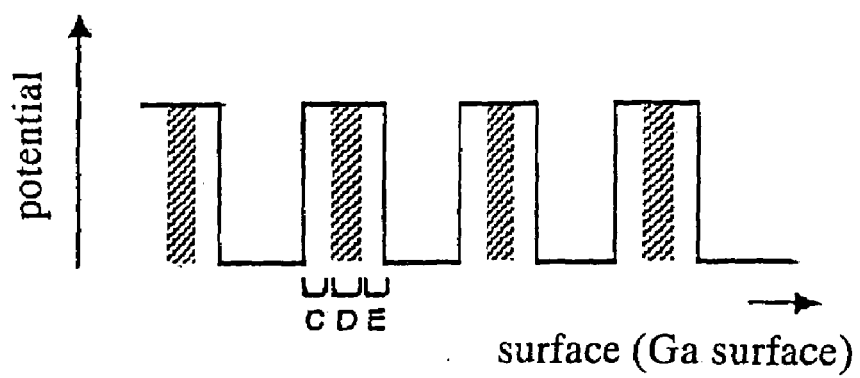

In a semiconductor laser shown in FIG. 8 in the above-mentioned example 2, samples of Si doping profile of an active layer such as FIG. 2A, FIG. 2C, and FIG. 2E were prepared and evaluated respectively.

Sample a uses an n-type impurity doping profile of FIG. 2A and is 10 nm in barrier layer and 3 nm in quantum well layer.

Sample b uses an n-type impurity doping profile of FIG. 2C and is 10 nm in barrier layer, 3 nm in quantum well layer, 5 nm in a barrier layer undoped region and 5 nm in a barrier layer n-type region.

Sample c uses an n-type doping profile of FIG. 2E and is 10 nm in barrier layer, 3 nm in quantum well layer, 5 nm in barrier layer undoped region, and respectively 2.5 nm in a barrier layer n-type region.

As to the samples a, b, and c, Si concentration is less than 1E17 cm−3 in the undoped region of the barrier layer and the Si concentration (average value) is 4E18 cm−3 in the n-type region of the barrier layer. Results are shown in Table 1. A structure of example 2 in which a direct underpart of the quantum well layer is undoped and a direct upper part is n-type doped is employed, whereby it was found that luminous efficiency is remarkably enhanced.

COMPARATIVE EXAMPLE 2

In a semiconductor laser shown in FIG. 8 in the above-mentioned example 2, a sample in which Si concentration (average value) of an n-type region (n-type $In_{0.02}Ga_{0.98}N$ layer 701) of a barrier layer was prepared and evaluated. Results are shown in Table 1. It was found that luminous efficiency preferably lowered in the Si concentration in the present comparative example.

TABLE 1

| Sample | doping method | light emission strength/a.u. | light emission life time/ns |
|---|---|---|---|
| comparative example 1 sample a | uniformly doping in a whole barrier layer | 9.0 | 0.6 |
| comparative example 1 sample b | doping directly beneath well layer | 3.5 | 0.31 |
| comparative example 1 sample c | with spacer layer (sandwich structure) | 4.3 | 0.37 |
| example 2 | doping just after well layer | 12 | 1.0 |
| comparative example 2 | doping just after well layer | 8 | 0.6 |

(Reference)

Figure 10:
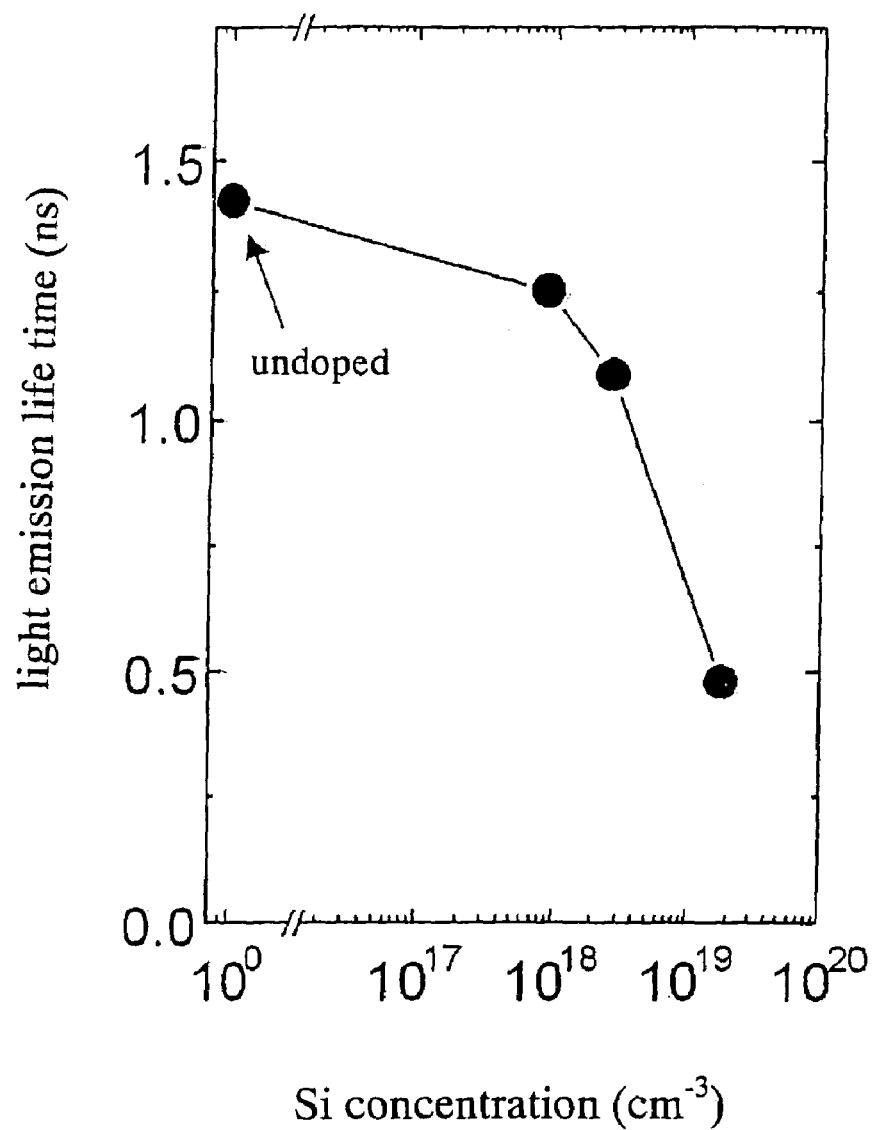
FIG. 10 is a graph showing a measurement result of change in light emission life time versus Si concentration in a semiconductor laser Si-doped into InGaN multi quantum well active layer.
Figure 11:
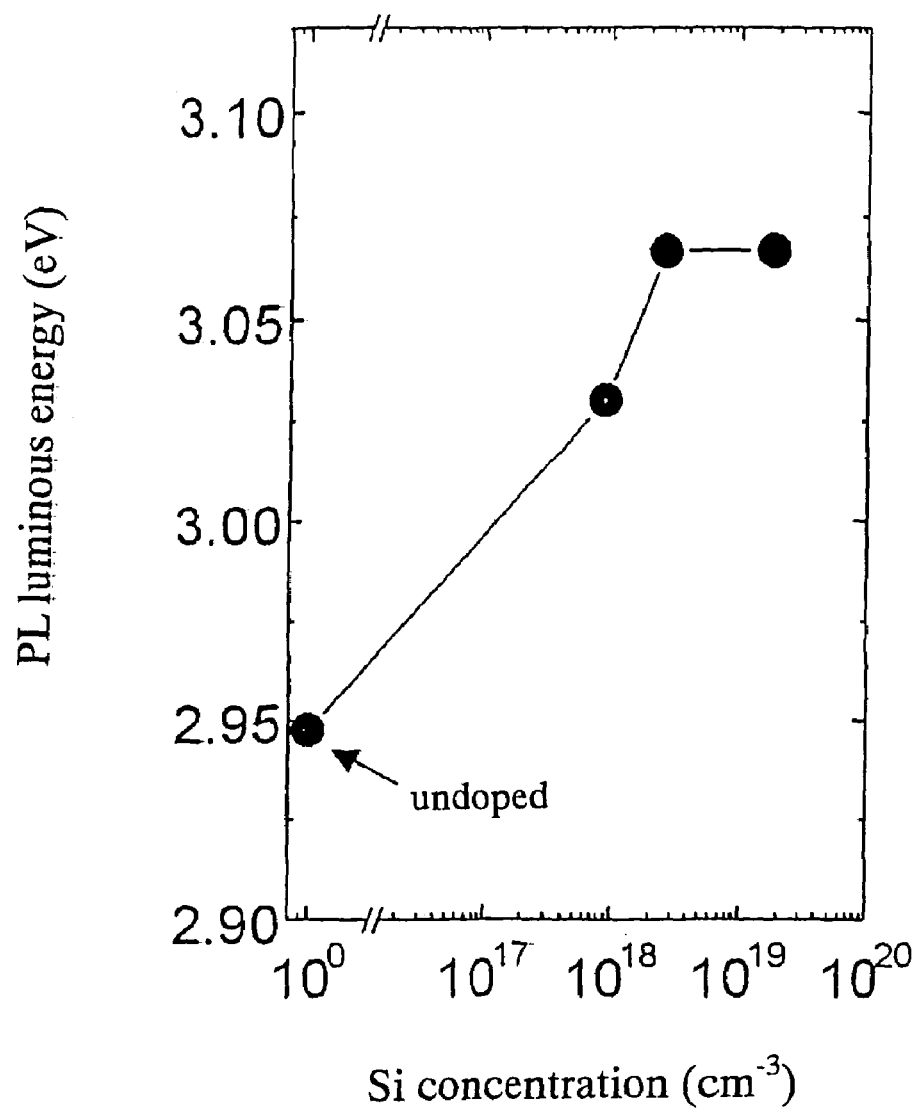
FIG. 11 is a graph showing a measurement result of change in PL light emitting wavelength, that is to say PL luminous energy versus Si concentration in a semiconductor laser Si-doped into InGaN multi quantum well active layer.
Figure 12:
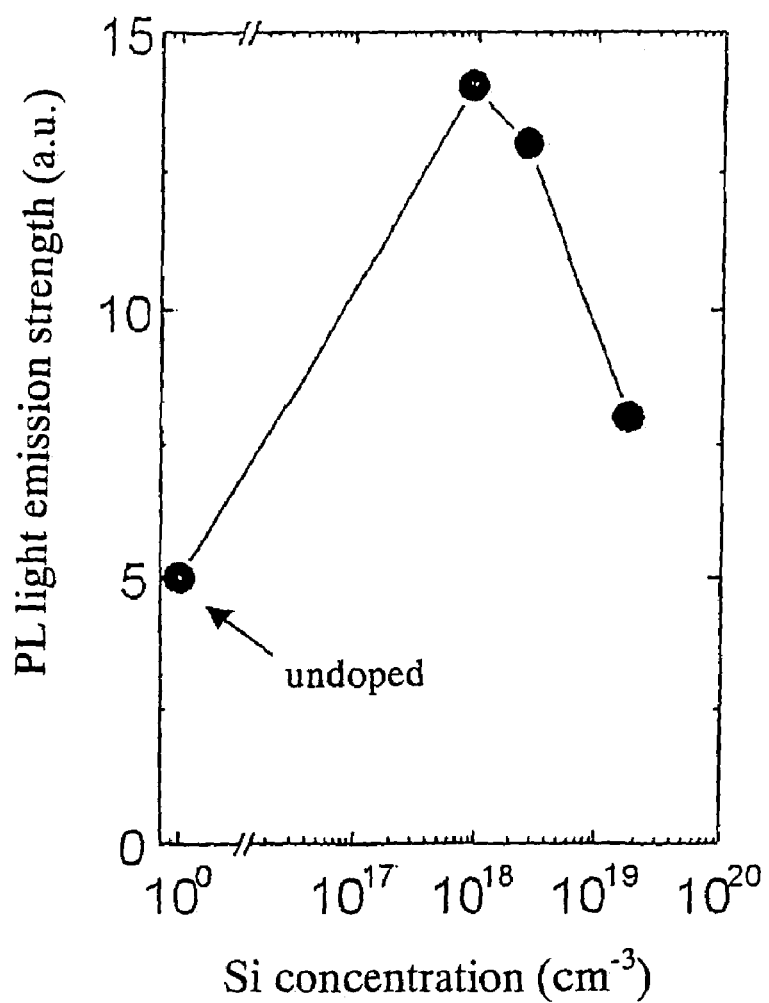
FIG. 12 is a graph showing a measurement result of change in PL light emission strength versus Si concentration in a semiconductor laser Si-doped into InGaN multi quantum well active layer.

FIG. 10 is a graph showing results that change in light emission life time versus Si concentration was measured in a semiconductor laser doped with Si into InGaN multi quantum well active layer. FIG. 11 is a graph showing results that change in PL light emitting wavelength, namely PL luminous energy, versus the Si concentration was measured in the semiconductor laser doped with Si into InGaN multi quantum well active layer. FIG. 12 is a graph showing results that change in PL light emission strength versus the Si concentration was measured in the semiconductor laser doped with Si into InGaN multi quantum well active layer.

A structure of the semiconductor laser is same as FIG. 2 except an active layer. A quantum well structure is a structure comprising three cycles of $In_{0.2}Ga_{0.8}N$ quantum well layer of film thickness of 3 nm and $In_{0.02}Ga_{0.98}N$ barrier layer of film thickness of 10 nm and is doped with Si in a whole barrier layer. The Si concentration was measured with SIMS. Second harmonic wave (SHG) of picosecond mode-locked Ti:Sapphire laser was used for an excitation light source for PL measurement, where wavelength was 370 nm, frequency 80 MHz and an average output 5 mW.

FIG. 10 is a graph showing a relation between the Si concentration and the light emission life time. It is found that the light emission life time rapidly shortens and the quantum well deteriorates when doping Si at a concentration of more than 5E18 cm−3. FIG. 11 is a graph showing a relation between the Si concentration and PL light emission wavelength. As the Si concentration increases, the light emission wavelength shortens, however it is found that the effect is saturated at an Si concentration of 5E18 cm−3. FIG. 12 is a graph showing a relation between the Si concentration and the light emission strength. It is found that the light emission strength lowers when the Si concentration is either too high or too low.

It is confirmed from the above that the light emission life time lowers when the Si concentration is too high and that luminous energy and light emission strength lower when the Si concentration is too low.

As shown in the above-mentioned reference, in a region in which impurity concentration is more than 5E18 cm−3 in a structure doped with Si in a whole barrier layer, while piezoelectric blocking effect is saturated, light emission life time rapidly shortens, therefore it is confirmed that luminous efficiency lowers even if the impurity concentration is increased in the region. The above-mentioned reference is an example in which n-type impurity is doped in a whole barrier layer, and obtained conclusion is true also in comparison of an example where a direct underpart of the quantum well layer is undoped and an example where a direct upper part of the quantum well layer is n-type doped (example 2 and comparative example 2). Namely, in example 2 in which impurity concentration in the barrier layer directly on the quantum well layer is approximately 5E18 cm−3, effect of improving luminous efficiency is acknowledged and in comparative example 2 in which the impurity concentration in the barrier layer directly on the quantum well layer is approximately 1e19 cm−3, the luminous efficiency deteriorates. When the impurity concentration is more than 1e19 cm−3, even if the quantum well layer is formed with sandwiching an undoped region thereafter, crystallinity is not sufficiently restored while forming the undoped region and defects in the quantum well layer increases, whereby it is inferred that the luminous efficiency deteriorates. In the present invention, the impurity concentration in the barrier layer directly on the quantum well layer is 5E18 cm−3 or less based on the above experiment results.

EXAMPLE 3

Figure 13:
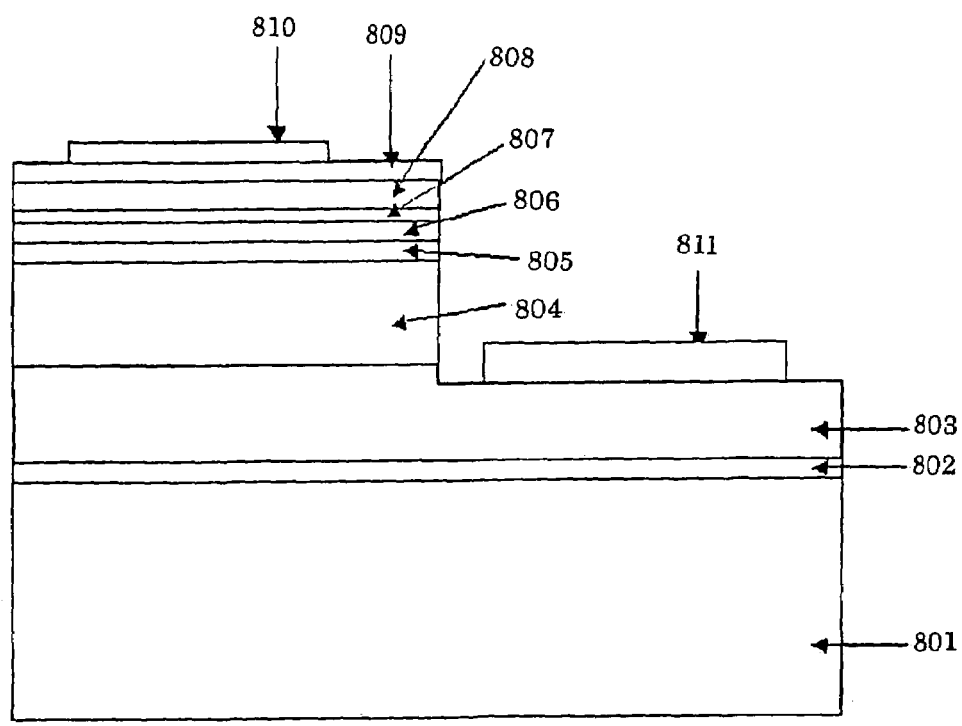
FIG. 13 is a schematic cross-sectional view of a III–V group nitride semiconductor laser according to a third embodiment in the present invention.

FIG. 13 is a schematic cross-sectional view of a III V group nitride semiconductor light emitting diode. A low temperature GaN buffer layer 802 of thickness of 40 nm was formed on a sapphire substrate 801 of thickness of 330 μm of which surface is C-plane. An n-type GaN contact layer 803 of thickness of 1.5 μm was formed on the low temperature GaN buffer layer 802. An n-type GaN layer 804 of thickness of 4 μm was formed on the GaN contact layer 803. An undoped GaN layer 805 of thickness of 7.5 nm was formed on the n-type GaN layer 804. An $In_{0.2}Ga_{0.8}N$ active layer 806 of thickness of 3 nm was formed on the undoped GaN layer 805. An n-type GaN layer 807 of thickness of 5 nm was formed on the $In_{0.2}Ga_{0.8}N$ active layer 806. A p-type $Al_{0.15}Ga_{0.85}N$ layer 808 of thickness of 50 nm was formed on the n-type GaN layer 807. A p-type GaN contact layer 809 of thickness of 20 nm was formed on the p-type $Al_{0.15}Ga_{0.85}N$ layer 808. A p-electrode 810 comprising a double layer metal structure of Ni/Au was further formed on the p-type GaN contact layer 809. The n-type GaN contact layer 803 was further exposed through etching, and an n-electrode 811 comprising a double layer metal of Ti/Al was formed thereon.

Manufacturing processes of a layer structure of FIG. 13 are then described. A MOCVD was used for formation of each semiconductor layer. Growth pressure was 100 Torr in all regions. $NH_3$ was used as a source of supply of a V-group element, TMG, TMA, TMI, $(EtCp)_2Mg$, and $SiH_4$ were used as a source of supply of a III-group element. Bubbling was performed to organic metals at respective cylinder temperatures of −10° C., 20° C., and 30° C. in $N_2$ of pressure of 760 Torr to supply the saturated vapor into a reactor. A sapphire substrate 801 of which surface is C-plane was provided within the reactor and heated up to 1100° C. in hydrogen atmosphere and the surface of the substrate was cleaned. The temperature of the substrate was then made to 500° C. and low temperature GaN buffer layer 802 of film thickness of 40 nm was formed on the sapphire substrate 801 by supplying TMG at 5 sccm and $NH_3$ at 10 slm. The supply of TMG was then stopped to make the temperature of the substrate into 1100° C. An n-type GaN contact layer 803 of thickness of 1.5 μm was then formed on the substrate 801 by supplying TMG at 15 sccm, $SiH_4$ as a dopant at 10 sccm and $NH_3$ at 10 slm. An n-type GaN layer 804 of thickness of 4 μm was further formed by supplying TMG at 15 sccm, $SiH_4$ at 5 sccm and $NH_3$ at 10 slm. Only the supply of $SiH_4$ was then suspended, and an undoped GaN layer 805 of thickness of 7.5 nm was formed by keeping on supplying TMG at 15 sccm and $NH_3$ at 10 slm for 100 second. The temperature of the substrate 801 was then maintained at 800° C. and an $In_{0.2}Ga_{0.8}N$ active layer of film thickness of 3 nm was formed by supplying TMG at 10 sccm, TMI at 50 sccm and $NH_3$ at 10 slm. An n-type GaN layer 807 of thickness of 5 nm was further formed by supplying TMG at 10 sccm, $SiH_4$ at 5 sccm and $NH_3$ at 10 slm.

The temperature of the sapphire substrate 801 was then maintained at 1100° C., and a p-type $Al_{0.15}Ga_{0.85}N$ layer 808 of thickness of 50 nm was formed by supplying TMG at 15 sccm, TMA at 5 sccm, $(EtCp)_2Mg$ as a dopant at 5 sccm and $NH_3$ at 10 slm. A p-type GaN contact layer 809 of thickness of 20 nm was then formed by supplying TMG at 15 sccm, $(EtCp)_2Mg$ at 5 sccm and $NH_3$ at 10 slm. Thereafter, the substrate was taken out of a growth equipment and a p-electrode 810 comprising a double layer metal structure of Ni/Au was formed through a vacuum deposition. The p-type GaN contact layer 809 was also exposed through etching and an n-electrode 811 comprising a double layer metal structure of Ti/Al was formed thereon through a vacuum deposition.

An obtained light emitting diode has a laminated structure in which an undoped GaN layer 805 is directly contacted with a lower surface of the active layer 806 and the n-type GaN layer 807 is directly contacted with an upper surface of the active layer 806. Profiles of respective layers are following.

The undoped GaN layer 805 consists of the undoped GaN and has a layer thickness of 7.5 nm and Si concentration of less than 1e17 cm−3. The active layer 806 consists of $In_{0.2}Ga_{0.8}N$ and has a layer thickness of 3 nm and Si concentration of less than 1e17 cm−3. The n-type GaN layer 807 consists of the n-type GaN and has a layer thickness of 5 nm and Si concentration (average value) of 4e18 cm−3. The Si concentration was measured with SIMS.

Also as to a sample formed a semiconductor layer in a process same as the above, a simple evaluation by a wet etching was performed to investigate polarity of a p-type GaN contact layer 809, whereby the surface of the layer was confirmed to be Ga surface (c-plane). An evaluation of performance as to the light emitting diode in the present example was performed, whereby excellent light emission strength and light emission life time were obtained.

Examples in the present invention were described in reference to the drawings as mentioned above, however the present invention is not limited to these and enables various kinds of variations. For instance, other layer of an extremely thin film of 2 nm or less may be sandwiched between the undoped region of the barrier layer and the quantum well layer or between the quantum well layer and the n-type region of the barrier layer. Also in the kind of the n-type impurity and the concentration, various kinds of embodiments may be employed without deviating from the scope of the present invention.

INDUSTRIAL APPLICABILITY

As described above, according to the present invention, a quantum well layer is formed on an undoped region and has a laminated structure where an n-type region is formed threron, and concentration of an n-type impurity in the n-type region is defined at a predetermined concentration. Thus, while an excellent crystallinity of an active layer is maintained, effect of piezoelectric field is reduced and superior luminous efficiency can be achieved.

What is claimed is:

1. A quantum well structure in which a stack of alternating layers including a quantum well layer and a barrier layer comprising a III-group nitride semiconductor are laminated in a direction of a crystal axis expressed in [x, y, −(x+y), z] (where x and y are any integer numbers and z is a natural number), wherein
the barrier layer includes an n-type region doped with n-type impurity and an undoped region,
an impurity concentration of the n-type region is 5E18 cm$^{-3}$ or less on an average,
thickness of the undoped region is 5 nm or more,
an upper surface of the barrier layer consists of the undoped region and a lower surface of the barrier layer consists of the n-type region, and
an upper surface of the quantum well layer is situated next to one of the n-type regions and a lower surface of the quantum well layer is situated next to one of the undoped regions.

2. A quantum well structure as claimed in claim 1, wherein the upper surface of the quantum well layer is directly contacted with the n-type region of the barrier layer and a region within at least 2 nm directly on the quantum well layer comprises the n-type region.

3. A quantum well structure as claimed in claim 1, wherein the upper surface of the quantum well layer is situated next to the n-type region of the barrier layer via a sandwiched undoped layer with thickness of 2 nm or less.

4. A quantum well structure as claimed in claim 1, wherein the impurity concentration of the n-type region is between 1E17 cm$^{-3}$ and 5E18 cm$^{-3}$ inclusive on an average.

5. A quantum well structure as claimed in claim 1, wherein the impurity concentration of the undoped region is less than 1E17 cm$^{-3}$ on an average.

6. A quantum well structure as claimed in claim 1, wherein an n-type impurity concentration of the whole barrier layer is 3E18 cm$^{-3}$ or less on an average.

7. A quantum well structure as claimed in claim 1, wherein the quantum well structure is formed on a III-group nitride semiconductor substrate in which a surface dislocation density is 1E8 cm$^{-2}$ or less.

8. A quantum well structure as claimed in claim 1, wherein thickness of the n-type region is between 2 nm and 10 nm inclusive.

9. A quantum well structure as claimed in claim 1, wherein the quantum well layer includes In.

10. A quantum well structure as claimed in claim 1, wherein the n-type impurity includes at least one element selected from a group consisting of Si, O, Ge, and Sn.

11. A quantum well structure as claimed in claim 1, wherein an n-type impurity concentration continuously changes between the n-type region and the undoped region in the barrier layer.

12. A quantum well structure as claimed in claim 1, wherein the quantum well structure is a multi quantum well structure.

13. A semiconductor device including a substrate and a quantum well structure formed thereon, in which a stack of alternating layers including a quantum well layer and a barrier layer comprising a III-group nitride semiconductor are laminated in a direction of a crystal axis expressed in [x, y, −(x+y), z] (where x and y are any integer numbers and z is a natural number), wherein
the barrier layer includes an n-type region doped with n-type impurity and an undoped region,
an impurity concentration of the n-type region is 5E18 cm$^{-3}$ or less on an average,
thickness of the undoped region is 5 nm or more,
an upper surface of the barrier layer consists of the undoped region and a lower surface of the barrier layer consists of the n-type region, and
an upper surface of the quantum well layer is situated next to one of the n-type regions and a lower surface of the quantum well layer is situated next to one of the undoped regions.

14. A semiconductor device as claimed in claim 13, wherein the upper surface of the quantum well layer is directly contacted with the n-type region of the barrier layer and a region within at least 2 nm directly on the quantum well layer comprises the n-type region.

15. A semiconductor device as claimed in claim 13, wherein the upper surface of the quantum well layer is situated next to the n-type region of the barrier layer via a sandwiched undoped layer with thickness of 2 nm or less.

16. A semiconductor device as claimed in claim 13, wherein the impurity concentration of the n-type region is between 1E17 cm$^{-3}$ and 5E18 cm$^{-3}$ inclusive on an average.

17. A semiconductor device as claimed in claim 13, wherein the impurity concentration of the undoped region is less than 1E17 cm$^{-3}$ on an average.

18. A semiconductor device as claimed in claim 13, wherein an n-type impurity concentration of the whole barrier layer is 3E18 cm$^{-3}$ or less on an average.

19. A semiconductor device as claimed in claim 13, wherein the substrate is a III-group nitride semiconductor substrate in which a surface dislocation density is 1E8 cm$^{-2}$ or less.

20. A semiconductor device as claimed in claim 13, wherein thickness of the n-type region is between 2 nm and 10 nm inclusive.

21. A semiconductor device as claimed in claim 13, wherein the quantum well layer includes In.

22. A semiconductor device as claimed in claim 13, wherein the n-type impurity includes at least one element selected from a group consisting of Si, O, Ge, and Sn.

23. A semiconductor device as claimed in claim 13, wherein an n-type impurity concentration continuously changes between the n-type region and the undoped region in the barrier layer.

24. A semiconductor device as claimed in claim 13, wherein the quantum well structure is an active layer.

25. A semiconductor device as claimed in claim 13, wherein the quantum well structure is a multi quantum well structure.

* * * * *